(12) United States Patent
Lin et al.

(10) Patent No.: US 12,433,059 B2
(45) Date of Patent: Sep. 30, 2025

(54) COMPOSITE ETCH STOP LAYERS FOR SENSOR DEVICES

(71) Applicant: TAIWAN SEMICONDUCTOR MANUFACTURING CO., LTD., Hsinchu (TW)

(72) Inventors: Cheng-Han Lin, Tainan (TW); Chao-Ching Chang, Kaohsiung (TW); Yi-Ming Lin, Tainan (TW); Yen-Ting Chou, Tainan (TW); Yen-Chang Chen, Tainan (TW); Sheng-Chan Li, Tainan (TW); Cheng-Hsien Chou, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 258 days.

(21) Appl. No.: 18/354,536

(22) Filed: Jul. 18, 2023

(65) Prior Publication Data

US 2023/0369516 A1 Nov. 16, 2023

Related U.S. Application Data

(60) Continuation of application No. 17/744,398, filed on May 13, 2022, now Pat. No. 11,749,760, which is a division of application No. 16/845,005, filed on Apr. 9, 2020, now Pat. No. 11,335,817.

(60) Provisional application No. 62/887,315, filed on Aug. 15, 2019.

(51) Int. Cl.
*H10F 77/30* (2025.01)
*H10F 39/00* (2025.01)
*H10F 71/00* (2025.01)
*H10F 77/40* (2025.01)

(52) U.S. Cl.
CPC ........... *H10F 77/30* (2025.01); *H10F 39/811* (2025.01); *H10F 71/00* (2025.01); *H10F 77/40* (2025.01)

(58) Field of Classification Search
CPC .................................................... H10F 39/804
See application file for complete search history.

(56) References Cited

U.S. PATENT DOCUMENTS

| | | | |
|---|---|---|---|
| 6,169,319 B1 * | 1/2001 | Malinovich | H10F 39/026 257/292 |
| 8,053,856 B1 | 11/2011 | Tu | |
| 8,405,182 B2 * | 3/2013 | Chou | H10F 39/8057 257/435 |

(Continued)

FOREIGN PATENT DOCUMENTS

| | | |
|---|---|---|
| CN | 105280652 A | 1/2016 |
| EP | 2216818 B1 | 6/2015 |

(Continued)

*Primary Examiner* — Evren Seven
(74) *Attorney, Agent, or Firm* — Maschoff Brennan (57) ABSTRACT

A device and method for fabricating the same is disclosed. For example, the device includes a sensor having a front side and a back side, a metal interconnect layer formed on the front side of the sensor, an anti-reflective coating formed on the back side of the sensor, a composite etch stop mask layer formed on the anti-reflective coating. wherein the composite etch stop mask layer includes a silicon nitride layer and a stressed layer. A percentage of Si—H bonds in the silicon nitride layer is greater than a percentage of Si—H bonds in the stressed layer.

20 Claims, 8 Drawing Sheets

(56) References Cited

U.S. PATENT DOCUMENTS

| | | | |
|---|---|---|---|
| 9,035,445 B2* | 5/2015 | Lin | H01L 21/76 |
| | | | 257/E23.141 |
| 9,105,490 B2 | 8/2015 | Wang et al. | |
| 9,236,267 B2 | 1/2016 | De et al. | |
| 9,236,300 B2 | 1/2016 | Liaw | |
| 9,397,128 B2* | 7/2016 | Gros | G02B 5/281 |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 2005/0032301 A1 | 2/2005 | Udayakumar | |
| 2008/0194115 A1 | 8/2008 | Kubota | |
| 2010/0006969 A1 | 1/2010 | Park | |
| 2010/0078687 A1 | 4/2010 | Zhang | |
| 2011/0018079 A1 | 1/2011 | Pain | |
| 2011/0199518 A1 | 8/2011 | Zheng | |
| 2015/0372030 A1 | 12/2015 | Cheng et al. | |
| 2019/0123604 A1 | 4/2019 | Yamagishi | |

FOREIGN PATENT DOCUMENTS

| | | |
|---|---|---|
| TW | 569346 B | 1/2004 |
| TW | 201628171 A | 8/2016 |

* cited by examiner

COMPOSITE ETCH STOP LAYERS FOR SENSOR DEVICES

CROSS-REFERENCES TO RELATED APPLICATION

This application is a continuation application of U.S. patent application Ser. No. 17/744,398 filed May 13, 2022, which a divisional application of U.S. patent application Ser. No. 16/845,005 filed Apr. 9, 2020, now U.S. Pat. No. 11,335,817, issued on May 17, 2022, which claims the priority of U.S. Provisional Application No. 62/887,315, filed Aug. 15, 2019, all of which are incorporated herein in their entirety.

BACKGROUND

Backside illuminated (BSI) sensors are a type of digital image sensor. The BSI sensor may include the same elements as a front-side illuminated sensor, but arranges the wiring behind the photocathode layer by flipping the silicon wafer during manufacturing and then thinning its reverse side so that light can strike the photocathode layer without passing through the wiring layer. The BSI sensor can increase the amount of light that is captured and, thus, improve low-light performance.

The BSI sensors are formed on silicon substrates of a wafer, followed by the formation of an interconnect structure on a front side of the silicon chip. The BSI sensors may generate electrical signals in response to the stimulation of photons. The magnitudes of the electrical signals may depend on the intensity of the incident light received by the respective image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The present disclosure is related to various embodiments of a semiconductor sensor device that reduces dark currents and improves dark signal non-uniformity. For example, the semiconductor sensor device of the present disclosure may use a composite etch stop layer (ESL) that includes multiple layers. The composite etch stop layer may include a compressive high density layer and hydrogen rich layer. The hydrogen rich layer can create dangling hydrogen bonds in the silicon sensor and the compressive high density layer may prevent hydrogen from escaping out of the semiconductor sensor device and drive hydrogen further into the silicon.

Dark current in an image sensor is generated in a pixel that is not due to the absorption of a photon or photo electrons. For example, operation of an image sensor is based around creating a pixel that has a collection area that is isolated and out of equilibrium. The photon generated carriers can be collected in the collection area to return volume back to equilibrium. However, carriers created by thermal process or high field effects can do the same, producing dark current. Dark current is a physical charge that adds to any photon generated charge.

Dark current may occur in every pixel, but may vary from pixel-to-pixel due to variation in the number of defects in the silicon sensor. Dark current can adversely affect the performance, accuracy, and/or sensitivity of the image sensor.

Dark signal non-uniformity (DSNU) may be seen as an offset between pixels in dark. DSNU can be measured in the absence of light and corrected by subtracting a dark frame. Large amounts of DSNU may also adversely affect the image that is captured by the image sensor. Thus, minimizing or reducing the amount of DSNU may improve the overall quality of the image that is captured by the image sensor.

The hydrogen atoms in the hydrogen rich layer of the composite etch stop layer of the present disclosure may be driven into a silicon layer of the semiconductor sensor device to form silicon-hydrogen dangling bonds. A dangling bond may refer to unpaired electrons or "free radicals" in a solid, such as a silicon substrate. The "free radicals" in the silicon substrate may be formed from exposure to various processing steps to form the semiconductor sensor device. The unpaired electrons in the silicon substrate may create defects that can negatively affect the performance of the semiconductor sensor device (e.g., creating dark currents or high DSNU, as noted above).

In one embodiment, the silicon-hydrogen dangling bonds may reduce the number of "free radicals" in the silicon substrate, thereby reducing the overall defects in the silicon sensor. Moreover, the compressive high density layer on top of the hydrogen rich layer may prevent the hydrogen from escaping out of the device and drive hydrogen further into the silicon layer. In other words, the compressive high density layer may help keep more hydrogen in the silicon, thereby increasing the number of dangling silicon-hydrogen bonds that can be formed.

Figure 1:
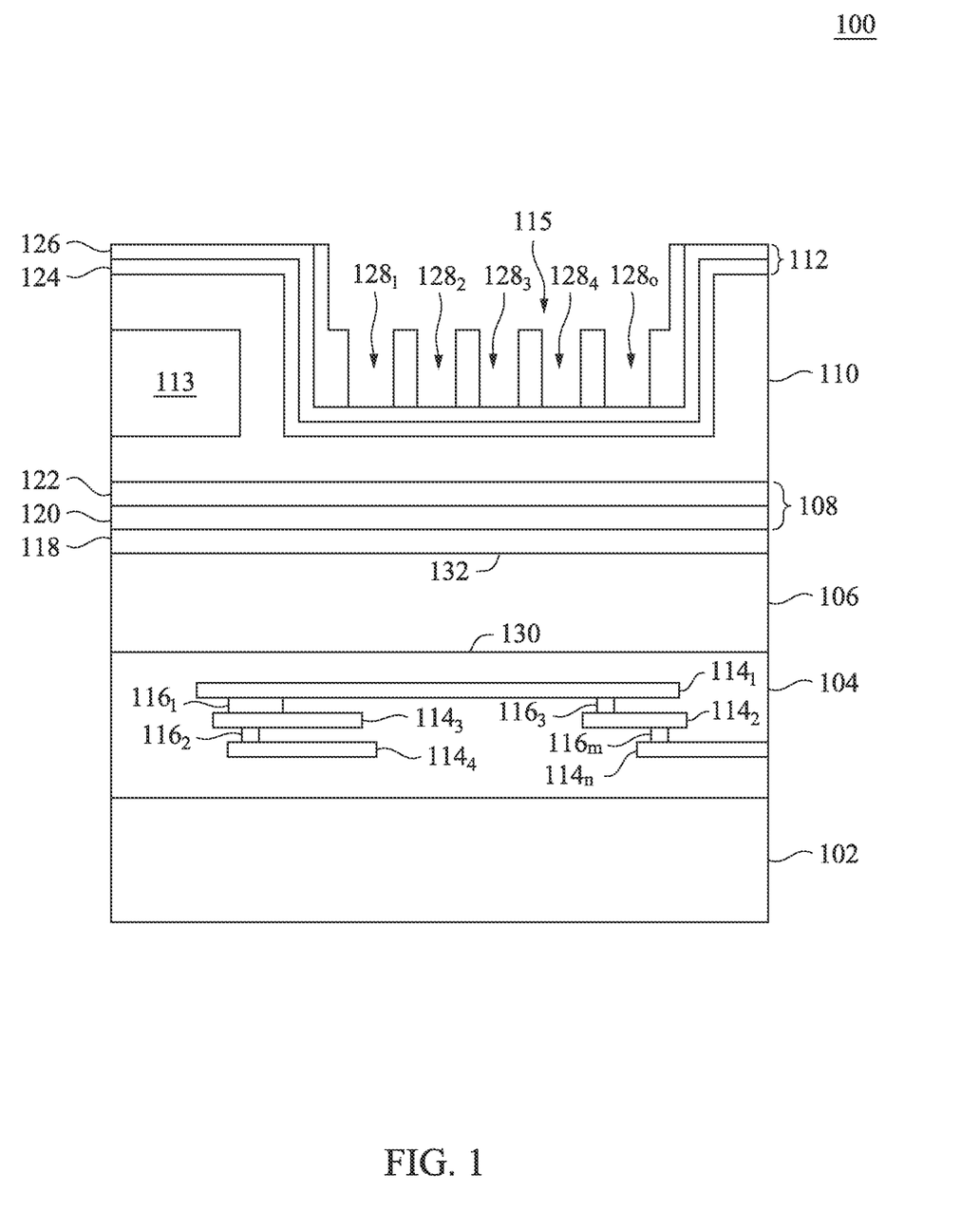
FIG. 1 illustrates a cross-sectional view of a semiconductor sensor device according to at least one embodiment of the present disclosure.

FIG. 1 illustrates a cross-sectional view of an example of a semiconductor sensor device 100 (also referred to herein as sensor device 100) of the present disclosure. The sensor device 100 may be a backside illuminated (BSI) complementary metal oxide semiconductor (CMOS) sensor. As noted above, the BSI sensors may collect light from a backside of a silicon substrate.

BSI sensors are replacing front-side sensors as BSI sensors may be more efficient and accurate in capturing images. For example, the BSI sensors may provide higher sensitivity, lower cross-talk, and comparable quantum efficiency as compared to front-side image sensors.

The image sensor in the BSI sensor may generate electrical signals in response to the stimulation of photons captured by the image sensor. The magnitudes of the electrical signals (e.g., photon-currents) may depend on the intensity of the incident light received by the respective image sensors.

It should be noted that FIG. 1 illustrates a portion of the sensor device 100. The sensor device 100 may include other portions that are not shown in FIG. 1. For example, the sensor device 100 may also include a periphery portion, a metal pad portion, and a back side layer that form the entire sensor device 100. The sensor device 100 may also include isolation regions in other portions of the sensor device 100 that are not shown. The sensor device 100 may also include a lens and a plurality of pixels of different colors. In other words, a plurality of the sensor devices 100 may be arranged in an array to form an array of pixels. Thus, it should be noted that the sensor device 100 illustrated in FIG. 1 may be simplified for ease of explanation.

In one embodiment, the sensor device 100 may include a substrate 106. The substrate 106 may be a semiconductor material, such as silicon (Si). However, the substrate 106 may include other semiconductor materials such as germanium or a diamond, or compound semiconductor materials such as silicon carbide, gallium arsenic, gallium phosphide, indium phosphide, indium arsenide, and the like.

In one embodiment, the substrate 106 may be doped with a dopant to form a light sensing region. The light sensing region of the substrate 106 may act as the sensor. The dopant may be a p-type dopant or an n-type dopant. Examples of p-type dopants may include boron, gallium, indium, and the like. Examples of n-type dopants may include phosphorus, arsenic, and the like. The substrate 106 may be doped with any method such as diffusion or ion implantation.

In one embodiment, the substrate 106 may include a front side 130 and a back side 132. In one embodiment, a metal interconnect layer (MIL) 104 may be formed on the front side 130 of the substrate 106. The MIL 104 may include metal layers $114_1$-$114_n$ (hereinafter also referred to individually as a metal layer 114 or collectively as metal layers 114) and vias $116_1$-$116_m$ (hereinafter also referred to individually as a via 116 or collectively as vias 116). In one embodiment, the metal layers 114 may include any type of conductive metal. For example, the metal layers 114 may include aluminum, titanium, tungsten, copper, tantalum, and the like.

The metal layers 114 and the vias 116 may be formed in a dielectric material or interlayer dielectric (ILD) of the MIL 104. The ILD may include silicon dioxide, silicon nitride, silicon oxynitride, TEOS oxide, phosphosilicate glass, borophosphosilicate glass, fluorinated glass, carbon doped silicon oxide, and the like. The metal layers 114 may be formed by any suitable process such as physical vapor deposition, chemical vapor deposition, or any combination thereof. Additional processes may include photolithography processing to pattern and etch the metal layers 114 and the vias 116.

In one embodiment, a carrier 102 may be coupled to the MIL 104. In one embodiment, an adhesive may be used to couple the carrier to the MIL 104. The carrier 102 may be a substrate or wafer (e.g., a silicon or glass substrate or wafer) bonded to the MIL 104. The carrier 102 may provide protection for the MIL 104 or any other features formed on the front side 130 of the substrate 106. The carrier 102 may also provide mechanical strength and support during processing of the back side 132 of the substrate 106.

In one embodiment, an anti-reflective coating 108 may be formed on the back side 132 of the substrate 106. The anti-reflective coating 108 may be located over the portions of the substrate 106 that are doped or may be located over the entire back side 132 of the substrate 106. The anti-reflective coating 108 may prevent light waves or photons from being reflected off of the underlying conductive layers in the MIL 104.

In one embodiment, the anti-reflective coating 108 may include at least one high-k dielectric layer. In one embodiment, the high-k dielectric layer may include a first high-k dielectric layer 120 and a second high-k dielectric layer 122.

In one embodiment, an oxide layer 118 may be deposited on the substrate 106 to improve adhesion of the anti-reflective coating 108 on the substrate 106. The oxide layer 118 may be formed using any type of oxidation process. Examples of oxidation processes may include wet or dry thermal oxidation processes or chemical vapor deposition (CVD) processes. For example, tetraethyl-ortho-silicate (TEOS) and oxygen may be used as a precursor during the CVD process to form the oxide layer 118.

In one embodiment, the high-k dielectric layer may include any high-k dielectric material. For example, the high-k dielectric material may be a metal oxide such as aluminum oxide, magnesium oxide, calcium oxide, hafnium oxide, zirconium oxide, yttrium oxide, tantalum oxide, strontium oxide, titanium oxide, lanthanum oxide, barium oxide, and the like. In one example, the first high-k dielectric layer 120 may comprise HfO and the second high-k dielectric layer 122 may comprise $Ta_2O_5$.

The first high-k dielectric layer 120 and the second high-k dielectric layer 122 may be deposited using any appropriate deposition process. For example, the first high-k dielectric layer 120 and the second high-k dielectric layer 122 may be deposited using a CVD process or a physical vapor deposition (PVD) process. The CVD process may be a plasma enhanced chemical vapor deposition, a low pressure chemical vapor deposition, an atomic layer deposition with or without plasma, and the like.

In one embodiment, the sensor device 100 may include a dielectric layer 110 formed on the anti-reflective coating 108. The dielectric layer 110 may protect the anti-reflective coating 108 and the substrate 106 during etching and processing of subsequently added layers. The dielectric layer 110 may be formed using any type of oxidation processes.

In one embodiment, a composite etch stop layer 112 may be formed on the dielectric layer 110. The composite etch stop layer 112 may be a multi-layered etch stop layer. In other words, the composite etch stop layer 112 may include a plurality of different layers. In other words, unlike conventional etch stop layers that are a single layer of silicon nitride, the composite etch stop layer 112 may include at least two different layers.

In one embodiment, the composite etch stop layer 112 may include a hydrogen rich layer 124 and a compressive high density layer 126. The compressive high density layer 126 may be deposited on top of the hydrogen rich layer 124. Said another way, the compressive high density layer 126 may be located between the hydrogen rich layer 124 and an oxide grid 115 (discussed in further detail below).

The hydrogen rich layer 124 and the compressive high density layer 126 may be deposited using a semiconductor deposition process such as CVD or PVD. In one embodiment, each of the hydrogen rich layer 124 and the compressive high density layer 126 may be deposited to a thickness of 100-3,000 angstroms. In one embodiment, the thickness of the hydrogen rich layer 124 and the compressive high density layer 126 may be the same.

In one embodiment, the hydrogen rich layer 124 may be hydrogen rich silicon nitride layer that is rich in Si—H bonds. In one example, the hydrogen rich layer 124 may have at least two times as many Si—H bonds as a single layer of silicon nitride used for conventional etch stop layers. In one embodiment, the hydrogen rich layer 124 may have almost 20 times as many Si—H bonds as the compressive high density layer 126.

In one embodiment, the amount of Si—H bonds in the hydrogen rich layer 124 may be an important factor in reducing the overall defects in the sensor device 100. For example, the silicon nitride layer in conventional etch stop layers may have approximately 10.4 atom percent Si—H bonds. The present disclosure doubles the amount of Si—H bonds to further reduce the amount of defects caused by "free radicals" in the silicon substrate.

However, adding more hydrogen to create more Si—H bonds may not be straight forward as the hydrogen may escape. The present disclosure includes the compressive high density layer 126 to prevent the hydrogen from escaping and driving the hydrogen further into the silicon layer to maintain the relatively high percentage Si—H bonds.

In one example, the hydrogen rich layer 124 may have greater than 12 atom percent of Si—H bonds. In one example, the hydrogen rich layer 124 may have greater than 20 atom percent Si—H bonds. In one example, the hydrogen rich layer 124 may have between 12 atom percent to 30 atom percent Si—H bonds. In one example, the hydrogen rich layer 124 may include approximately 21 atom percent Si—H bonds.

In one example, the compressive high density layer 126 may be any type of material that has a high mechanical stress (e.g., measured in megapascals (MPa)). The mechanical stress of the compressive high density layer 126 may be measured as a compressive stress (e.g., values less than 0). For example, the compressive stress of the compressive high density layer 126 may be much greater than the compressive stress of a single layer of silicon nitride used for conventional etch stop layers. For example, the compressive stress of the compressive high density layer 126 may be approximately −730 MPa compared to approximately −55 MPa for the silicon nitride used in conventional etch stop layers.

In one embodiment, the compressive high density layer 126 may have a compressive stress of greater than −300 MPa. In one embodiment, the compressive stress of the compressive high density layer 126 may be between −500 MPa to −1,000 MPa. In one embodiment, the compressive stress of the compressive high density layer 126 may be between −700 MPa to −750 MPa. In one embodiment, the compressive stress of the compressive high density layer 126 may be approximately −730 MPa.

In one embodiment, the hydrogen rich layer 124 may also have a relatively high mechanical stress. The mechanical stress of the hydrogen rich layer 124 may be measured as a tensile stress (e.g., value greater than 0). In one embodiment, the hydrogen rich layer 124 may have a tensile stress of greater than 100 MPa. In one embodiment, the tensile stress of the hydrogen rich layer 124 may be between 200 MPa to 400 MPa. In one embodiment, the tensile stress of the hydrogen rich layer 124 may be approximately 300 MPa.

In one embodiment, the compressive high density layer 126 may be a high density silicon nitride layer. Other examples of materials that may be used as the compressive high density layer 126 may include silicon dioxide, silicon oxy-nitride, silicon carbide, undoped silicon glass (USG), high-stress undoped silicate glass (HSUSG), a nitrogen free anti-reflection layer (NFARL), and the like.

As noted above, the hydrogen rich layer 124 may provide hydrogen atoms that may form dangling Si—H bonds in the substrate 106. The dangling Si—H bonds may reduce the number of defects in the substrate 106, which may reduce dark current and improve DSNU. In addition, the compressive high density layer 126 may prevent the hydrogen atoms from escaping out of the sensor device 100 and drive the hydrogen atoms further into the substrate 106.

It has been shown that the composite etch stop layer 112 of the present disclosure can improve dark current by as much as 10% and improve DSNU by as much as 25%. In one embodiment, the above improvements can be seen in an embodiment where the compressive high density layer 126 has a compressive stress of approximately −730 MPa with approximately 1.2 atom percent Si—H bonds. The hydrogen rich layer 124 may have a tensile stress of approximately 309 MPa with approximately 21.0 atom percent Si—H bonds. Thus, the composite etch stop layer 112 of the present disclosure helps produce a more accurate and better performing sensor device 100 compared to conventional sensor designs.

In one embodiment, the sensor device 100 may include a conductive layer 113. The conductive layer 113 may connect the sensor device 100 to a logic device or wafer. The conductive layer 113 may be formed in the dielectric layer 110 and between the composite etch stop layer 112 and the second high-k dielectric layer 122 of the anti-reflective coating 108. The conductive layer 113 may be any conductive metal or metal compound such as aluminum, copper, titanium, aluminum copper alloys, and the like.

The sensor device 100 may also include an oxide grid 115. The oxide grid 115 may include features $128_1$-$128_o$ (hereinafter also referred to individually as a feature 128 or collectively as features 128). The features 128 may be etched out of a layer of oxide to form the oxide grid 115. The oxide grid 115 may act as a light filter to filter light or photons that are directed towards the sensor device 100. As noted above, the sensor device 100 may also include a lens (not shown) over the oxide grid 115.

Figure 2:
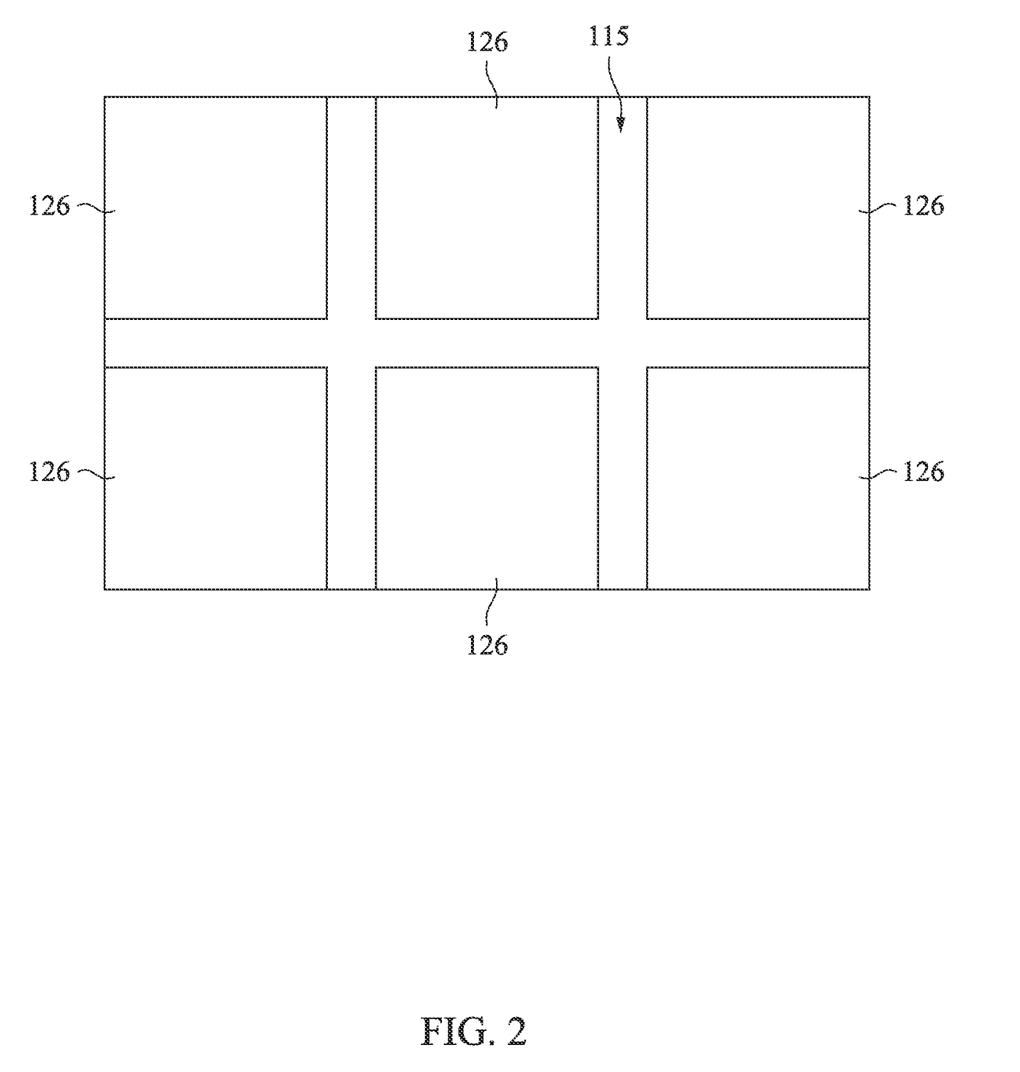
FIG. 2 illustrates a top view of an oxide grid of the semiconductor sensor device.

FIG. 2 illustrates a top view of the oxide grid 115 of the sensor device 100. In one embodiment, the top surface of the compressive high density layer 126 can be seen between the walls of the oxide grid 115. In one embodiment, each area of the compressive high density layer 126 between the walls of the oxide grid 115 may be associated with a different pixel.

Figure 3:
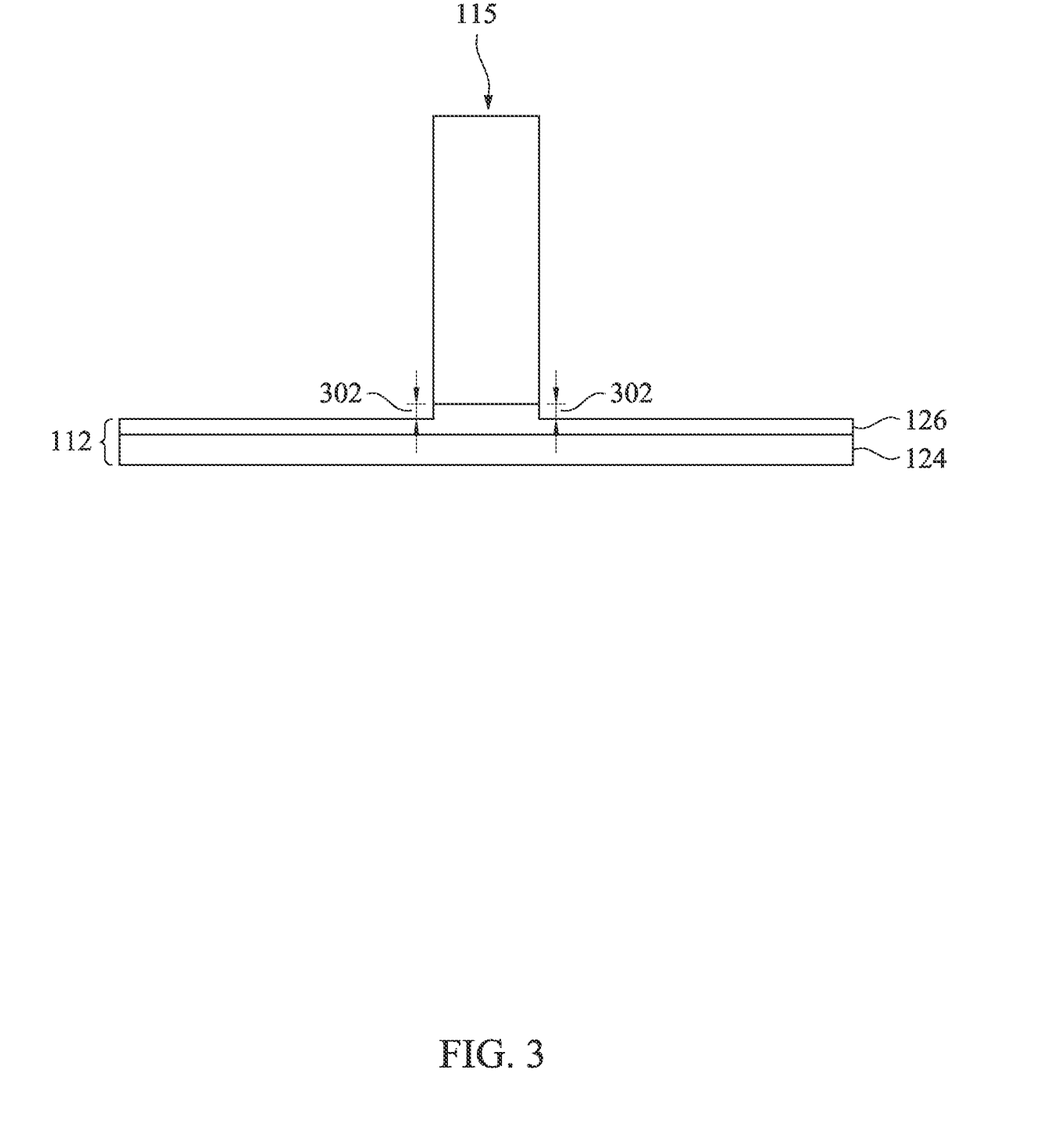
FIG. 3 illustrates a cross-sectional view of a portion of the light filter and the etch stop layer of the present disclosure.

FIG. 3 illustrates a cross-sectional view of the oxide grid 115 and the composite etch stop layer 112. FIG. 3 illustrates how a portion of the compressive high density layer 126 may be etched when the features 128 are etched to form the oxide grid 115. In one embodiment, the compressive high density layer 126 may be etched by a depth 302. The hydrogen rich layer 124 may not be etched and remain below the compressive high density layer 126.

Figure 4:
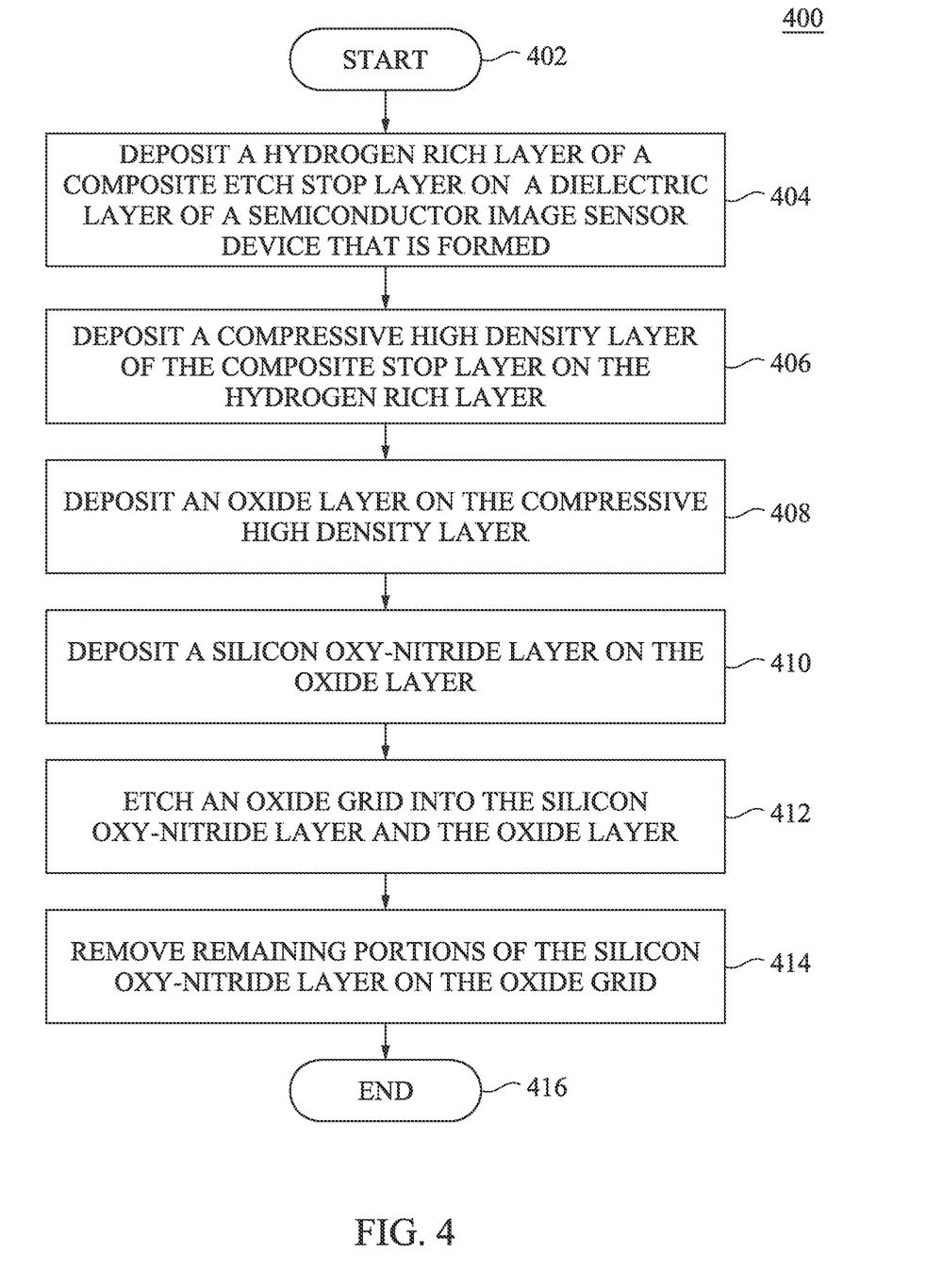
FIG. 4 illustrates a flowchart of a method of forming a semiconductor sensor device according to at least one embodiment of the present disclosure.

FIG. 4 illustrates a flowchart of a method 400 of forming a semiconductor sensor device according to at least one embodiment of the present disclosure. The method 400 may be performed via one or more different tools within a fabrication plant under the control of controller or processor.

While the method 400 is illustrated and described below as a series of acts or events, it will be appreciated that the illustrated ordering of such acts or events are not to be interpreted in a limiting sense. For example, some acts may occur in different orders and/or concurrently with other acts or events apparat from those illustrated and/or described herein. In addition, not all illustrated acts may be required to implement one or more aspects or embodiments of the description herein. Further, one or more of the acts depicted herein may be carried out in one or more separate acts and/or phases.

Figure 5A:
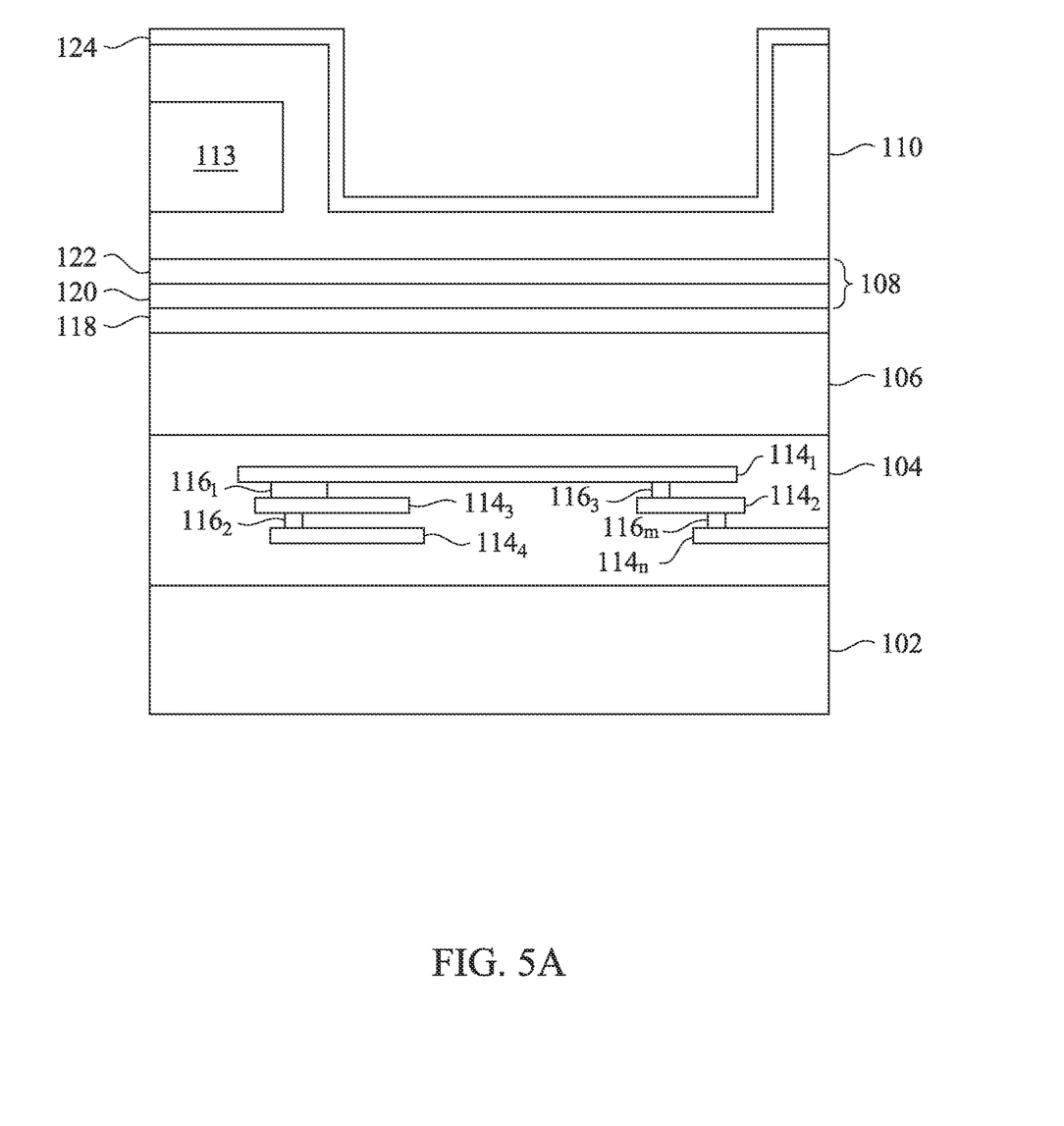
FIGS. 5A-5D are partial cross-sectional views of the semiconductor sensor device at various stages of manufacture in accordance with at least one embodiment of the present disclosure.

The method 400 begins at block 402. At block 404, the method 400 performs the block 402 to deposit a hydrogen rich layer of a composite etch stop layer on a dielectric layer of a semiconductor sensor device that is formed. A cross-sectional view of the semiconductor sensor device with the hydrogen rich layer deposited on the dielectric layer is illustrated in FIG. 5A, and discussed below. As noted above, the semiconductor sensor device may be fabricated from a substrate, such as silicon or glass. A metal interconnect layer may be formed on a front side of the substrate. A carrier substrate may be coupled to the metal interconnect layer to provide protection and support.

In one embodiment, the substrate may be doped to form a sensor. The back side of the substrate may be doped. An anti-reflective coating may be formed on the back side of the substrate. In one embodiment, the anti-reflective coating may be formed over portions of the back side of the substrate that are doped. A dielectric layer may then be deposited on the anti-reflective coating. The hydrogen rich layer may be deposited on the dielectric layer.

In one embodiment, the hydrogen rich layer may be a hydrogen rich silicon nitride layer. In other words, the silicon nitride layer may have large amounts of Si—H bonds. In one example, the hydrogen rich layer may have greater than 12 atom percent of Si—H bonds. In one example, the hydrogen rich layer may have greater than 20 atom percent Si—H bonds. In one example, the hydrogen rich layer may have between 12 atom percent to 30 atom percent Si—H bonds. In one example, the hydrogen rich layer may include approximately 21 atom percent Si—H bonds.

Figure 5B:
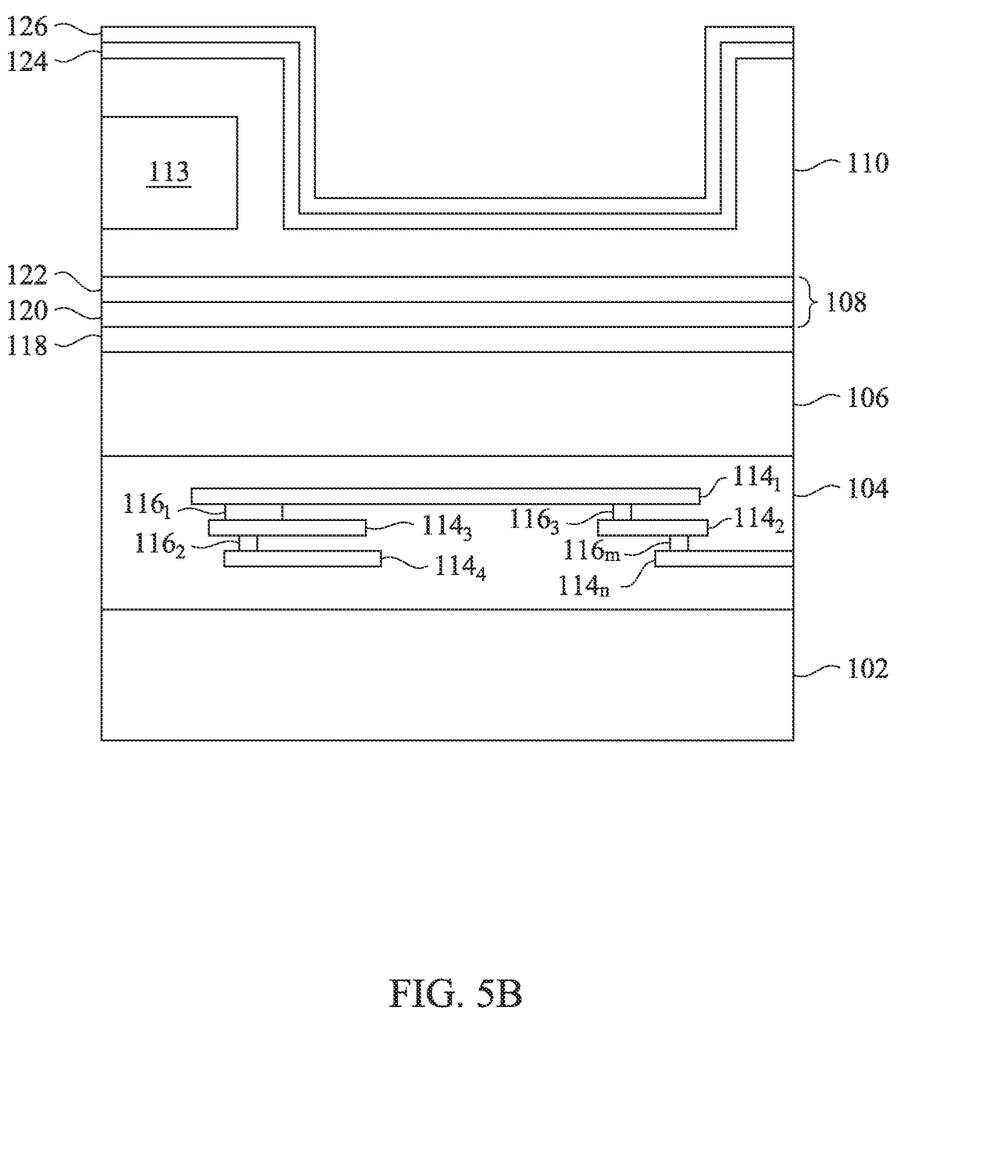

At block 406, the method 400 performs the block 406 to deposit a compressive high density layer of the composite etch stop layer on the hydrogen rich layer. A cross-sectional view of the semiconductor sensor device with the compressive high density layer deposited on the hydrogen rich layer is illustrated in FIG. 5B, and discussed below. The compressive high density layer may be any type of material that has a high mechanical stress (e.g., measured in MPa). In one embodiment, the compressive high density layer may have a compressive stress of greater than −300 MPa. In one embodiment, the compressive stress of the compressive high density layer may be between −500 MPa to −1,000 MPa. In one embodiment, the compressive stress of the compressive high density layer may be between −700 MPa to −750 MPa. In one embodiment, the compressive stress of the compressive high density layer may be approximately −730 MPa.

The compressive high density layer may be deposited on top of the hydrogen rich layer. The compressive high density layer prevent the hydrogen atoms from escaping the semiconductor device. In addition, the compressive high density layer may drive the hydrogen from the hydrogen rich layer further into the substrate to create dangling Si—H bonds in the substrate. As a result, the composite etch stop layer formed by the hydrogen rich layer and the compressive high density layer may reduce dark currents and improve DSNU in the semiconductor sensor device.

Figure 5C:
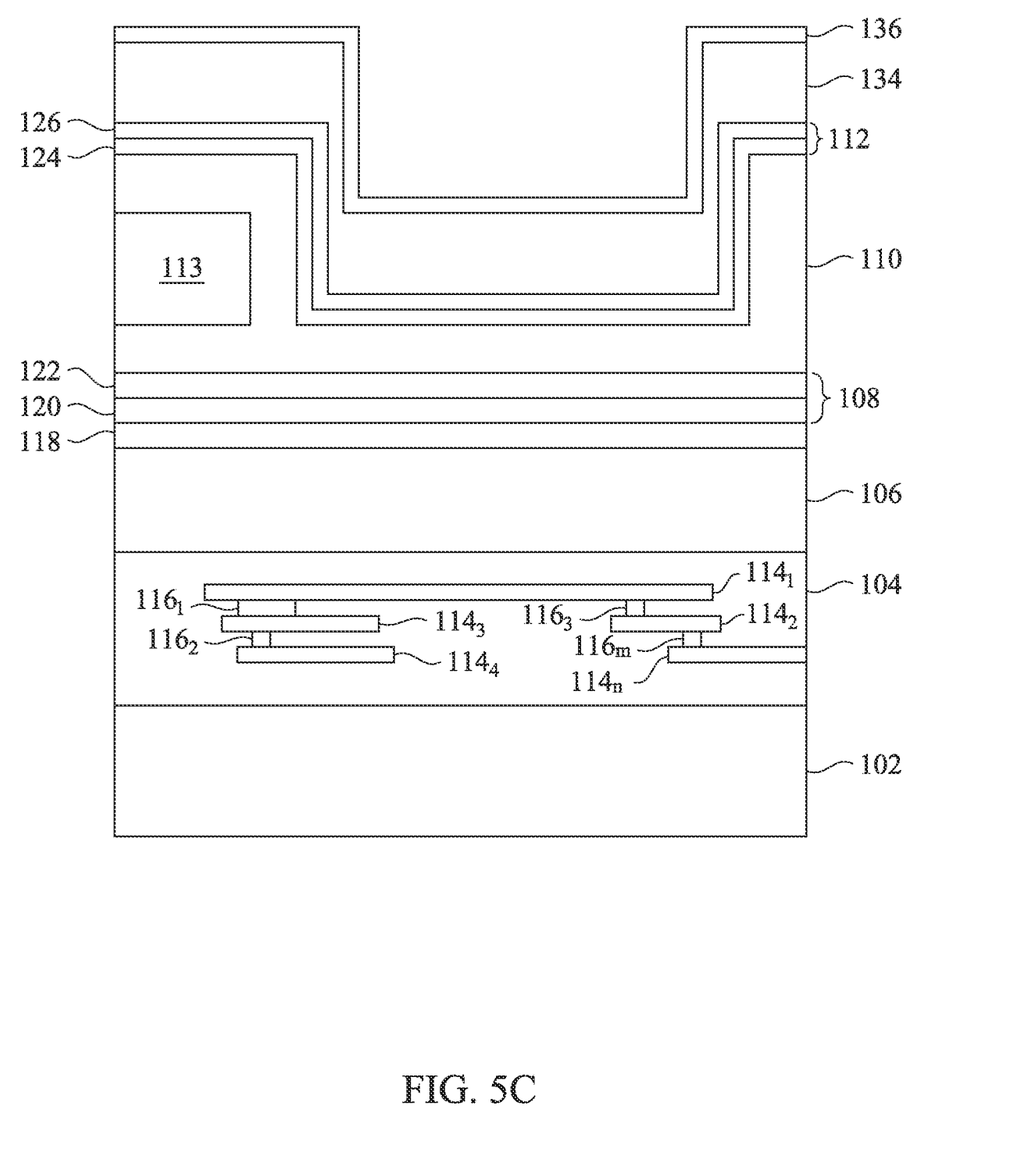

At block 408, the method 400 performs block 408 to deposit an oxide layer on the compressive high density layer. A cross-sectional view of the semiconductor sensor device with the oxide layer deposited on the compressive high density layer is illustrated in FIG. 5C, and discussed below. The oxide layer may be deposited or grown using any type of oxidation process.

At block 410, the method 400 performs block 410 to deposit a silicon oxy-nitride layer on the oxide layer. A cross-sectional view of the semiconductor sensor device with the silicon oxy-nitride layer deposited on the oxide layer is illustrated in FIG. 5C, and discussed below. The silicon oxy-nitride layer may serve as a hard mask to block etching of portions of the oxide layer.

Figure 5D:
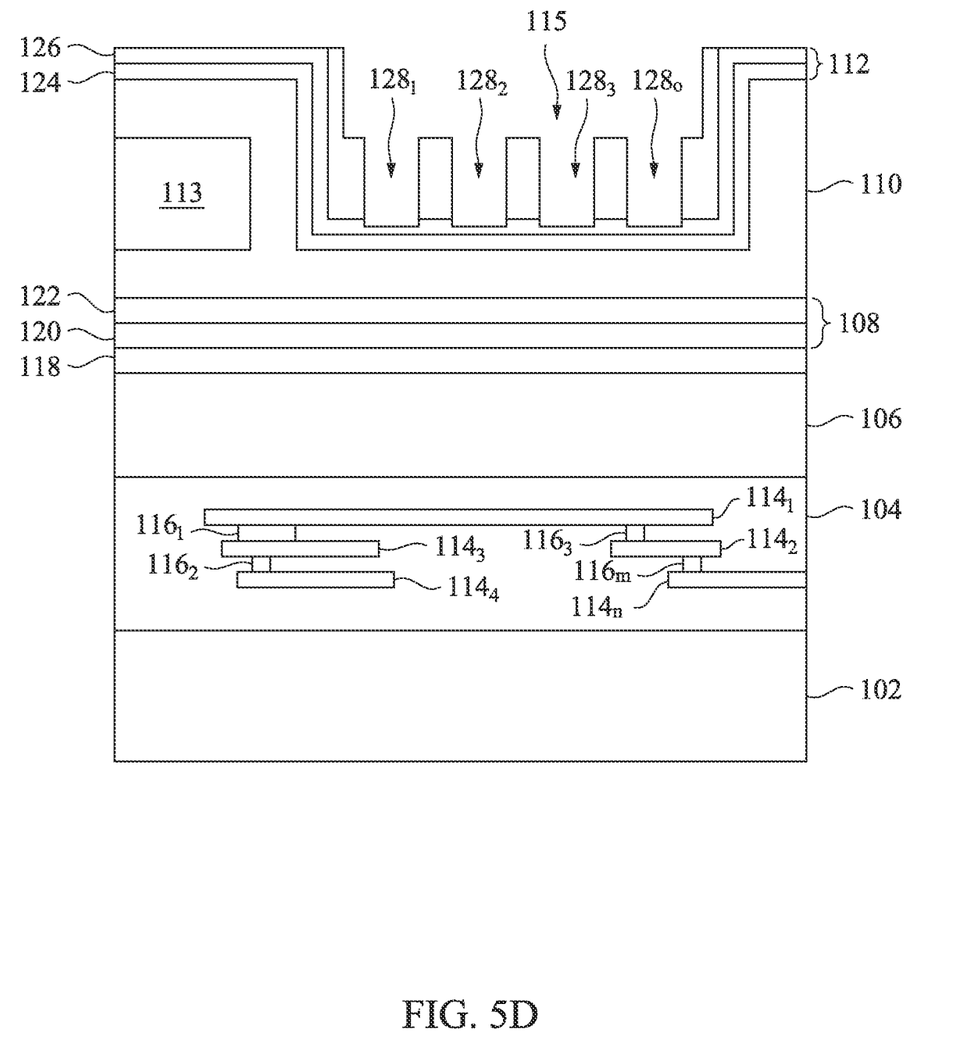

At block 412, the method 400 performs the block 412 to etch an oxide grid into the silicon oxy-nitride layer and the oxide layer. A cross-sectional view of the semiconductor sensor device that shows the oxide grid etched into the silicon oxy-nitride layer is illustrated in FIG. 5D, and discussed below. For example, a photolithography and etch process may be used to etch the features in the oxide layer and form the oxide grid. For example, photoresist may be spun onto the silicon oxy-nitride layer and the desired pattern for the oxide grid may be exposed onto the photoresist and transferred to the silicon oxy-nitride layer.

A selective etching process may be applied to etch away the portions of the silicon oxy-nitride that are patterned and the portions of the oxide layer below the silicon oxide-nitride layer that are patterned. The selective etching process may be a wet etch process, a dry etch process, or a combination of both.

At block 414, the method 400 performs the block 414 to remove remaining portions of the silicon oxy-nitride layer on the oxide grid. For example, silicon oxy-nitride may remain on top of the portions of the oxide layer that were not etched. A wet etch, dry etch, or a combination of both, may be used to remove the remaining portions of the silicon oxy-nitride layer.

In one embodiment, additional blocks may be performed (e.g., adding a lens, forming isolation regions, forming metal pads, and the like). At block 416, the method 400 ends.

FIGS. 5A-5D illustrate a plurality of partial cross-sectional views illustrating one embodiment of a method of forming the sensor device 100 at various stages of manufacture in accordance with at least one embodiment of the present disclosure. FIGS. 5A-5D may also illustrate and/or correspond to the various blocks of the method 400 described above.

Referring to FIG. 5A, FIG. 5A illustrates portions of the sensor device 100 before the composite etch stop layer 112 is deposited. For example, as described above, the sensor device 100 may include a substrate 106 that includes a front side and a back side. The MIL 104 may be formed on the front side of the substrate 106. The MIL 104 may include metal layers 114 and vias 116 formed in an ILD.

In one embodiment, the back side of the substrate 106 may be doped to form a sensor. The anti-reflective coating 108 may be formed on the back side of the substrate 106. For example, the anti-reflective coating 108 may include an oxide layer 118, a first high-k dielectric layer 120 and a second high-k dielectric layer 122. In one embodiment, the first high-k dielectric layer 120 may be HfO having a thickness of approximately 60 angstroms. In one embodiment, the second high-k dielectric layer 122 may be $Ta_2O_5$ having a thickness of approximately 520 angstroms.

A dielectric layer 110 may be formed on top of the anti-reflective coating 108. The dielectric layer 110 may protect the substrate 106 from damage during the subsequent deposition and processing steps. The dielectric layer 110 may have a thickness of approximately 4,000 angstroms.

In one embodiment, a conductive layer 113 may be formed in the dielectric layer 110. For example, the conductive layer 113 may be deposited onto the dielectric layer 110 and the additional dielectric layer 110 may be formed over the conductive layer 113.

In one embodiment, a hydrogen rich layer 124 of the composite etch stop layer 112 may be deposited onto the dielectric layer 110. The hydrogen rich layer 124 may be deposited using any semiconductor deposition process such as CVD or PVD. The hydrogen rich layer 124 may be deposited to have a thickness of between 100-3,000 angstroms.

In FIG. 5B, a compressive high density layer 126 may be deposited over the hydrogen rich layer 124. The compressive high density layer 126 may be deposited using any semiconductor deposition process such as CVD or PVD. The compressive high density layer 126 may be deposited to have a thickness of approximately 100-3,000 angstroms.

In FIG. 5C, an oxide layer 134 and a silicon oxy-nitride (SiON) layer 136 may be deposited on the compressive high density layer 126. In one embodiment, the oxide layer 134 may be grown using any type of oxidation process. The oxide layer 134 may be grown to have a thickness of approximately 5,600 angstroms.

In one embodiment, the SiON layer 136 may be deposited onto the oxide layer 134 using any type of semiconductor deposition process such as CVD or PVD. In one embodiment, the SiON layer 136 may be deposited to have a thickness of approximately 1,500 angstroms.

In FIG. 5D, the oxide layer 134 may be etched with features 128 to form an oxide grid 115. In one embodiment, photolithography and etching processes may be carried out to perform the etching of the oxide layer 134. For example, the SiON layer 136 may be coated with a photoresist. A ultraviolet light source may be used to expose the photoresist with a desired pattern of the oxide grid 115. The pattern may be transferred to the SiON layer 136. The portions of the SiON layer 136 that are not exposed may serve has a hard mask to prevent etching of the oxide layer 134 below the unexposed portions of the SiON layer 136.

After exposure and bake of the photoresist, a selective etching process may be applied to etch the exposed portions of the photoresist, SiON layer 136 and the oxide layer 134. For example, a wet etch process, a dry etch process, or a combination of both may be used to perform the selective etching. As can be seen in FIG. 5D, a portion of the top surface of the compressive high density layer 126 may also be etched.

After the features 128 are etched into the oxide layer 134, the remaining photoresist and previously unexposed portions of the SiON layer 136 may be removed. For example, additional wet etch or dry etch processes may be applied. The resulting structure may be the oxide grid 115 formed on the composite etch stop layer 112.

The oxide grid 115 may also be referred to as a light filter. For example, light or photons may enter the back side of the substrate 106 through the oxide grid 115. In one embodiment, the final product illustrated in FIG. 5D may form a pixel of the semiconductor image sensor 100. However, as noted above, the semiconductor sensor device 100 may include a plurality of pixels arranged in arrays of pixels. In addition, the semiconductor sensor device 100 may also include other structures that are not shown.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Therefore, the present disclosure relates to a device or a semiconductor sensor device and method for forming the same. In some embodiments, the present disclosure relates to a semiconductor sensor device that reduces dark currents and dark signal non-uniformity via a composite etch stop mask layer. The composite etch stop mask layer includes a hydrogen rich layer and a compressive high density layer. A light filter may be formed on the composite etch stop mask layer, which is formed on an anti-reflective coating on a back side of a sensor. A metal interconnect layer may be formed on the front side of the sensor.

In other embodiments, the present disclosure relates to a device that includes a hydrogen rich silicon nitride layer and a compressive high density layer to reduce dark currents and dark signal non-uniformity. The device includes a silicon substrate comprising a light sensor. A metal interconnect layer is formed on the front side of the sensor. An oxide layer is formed on the back side of the silicon substrate. A high-k dielectric layer is formed on the oxide layer. A dielectric layer is formed on the high k dielectric layer. The hydrogen rich silicon nitride layer is formed on the dielectric layer. The compressive high density layer is formed on the hydrogen rich silicon nitride layer. An oxide grid is formed on the compressive high density layer.

In yet other embodiments, the present disclosure relates to a method for forming a semiconductor sensor device that reduces dark currents and improves dark signal non-uniformity. The method comprises depositing a hydrogen rich layer of a composite etch stop layer on a dielectric layer of a portion of the semiconductor image sensor device that is formed. For example, the semiconductor image sensor may include a silicon substrate with a metal interconnect layer on a front side of the silicon substrate and an anti-reflective coating formed on the back side of the silicon substrate. The dielectric layer may be formed on the anti-reflective coating. A compressive high density layer is deposited on the hydrogen rich layer. An oxide layer is deposited on the compressive high density layer. A silicon oxy-nitride layer is deposited on the oxide layer. An oxide grid is etched into the silicon oxy-nitride layer and the oxide layer. Remaining portions of the silicon oxy-nitride layer is removed from the oxide grid.

What is claimed is:

1. An image sensor, comprising:
a substrate having a plurality of pixel regions;
an grid structure over the substrate; and
a silicon nitride layer between the grid structure and the substrate; and
a stressed layer between the silicon nitride layer and the grid structure, wherein a percentage of Si—H bonds in the silicon nitride layer is greater than a percentage of Si—H bonds in the stressed layer.

2. The image sensor of claim 1, wherein the stressed layer comprises silicon nitride.

3. The image sensor of claim 1, wherein the stressed layer has a compressive stress.

4. The image sensor of claim 1, wherein the silicon nitride layer has a different type of stress than the stressed layer.

5. The image sensor of claim 4, wherein the silicon nitride layer has a tensile stress.

6. The image sensor of claim 1, wherein the stressed layer has a first thickness at a region overlapping the grid structure and a second thickness at a region non-overlapping the grid structure, and the first thickness is greater than the second thickness.

7. The image sensor of claim 1, further comprising:
an interconnect structure over a first side of the substrate, wherein the grid structure is over a second side of the substrate opposite the first side of the substrate.

8. The image sensor of claim 1, further comprising:
a conductive layer between the silicon nitride layer and the substrate.

9. An image sensor, comprising:
a plurality of sensing pixels in a substrate;
a hydrogen-containing layer over the plurality of sensing pixels;
a stressed layer over the hydrogen-containing layer, wherein a stress in the stressed layer is greater than a stress in the hydrogen-containing layer; and
a grid structure spaced apart from the hydrogen-containing layer by the stressed layer.

10. The image sensor of claim 9, wherein the stress in the stressed layer is a compressive stress.

11. The image sensor of claim 9, wherein the stress in the hydrogen-containing layer is a tensile stress.

12. The image sensor of claim 9, wherein the hydrogen-containing layer comprises silicon nitride.

13. The image sensor of claim 9, wherein the stressed layer comprises silicon nitride.

14. The image sensor of claim 9, wherein an atom percent of Si—H bonds in the hydrogen-containing layer is greater than an atom percent of Si—H bonds in the stressed layer.

15. The image sensor of claim 9, wherein the hydrogen-containing layer comprises greater than 12 atom percent of Si—H bonds.

16. The image sensor of claim 9, wherein the hydrogen-containing layer is over a backside of the substrate.

17. An image sensor, comprising:
a substrate comprising a photo sensing region;
a multi-layered nitride film over the substrate, the multi-layered nitride film comprising a first nitride layer over the substrate and a second nitride layer over the first nitride layer, the first nitride layer having a first stress, and the second nitride layer having a second stress, the first stress and the second stress being of different types of stress; and
a grid structure over the multi-layered nitride-containing film.

18. The image sensor of claim 17, wherein the first stress of the first nitride layer is a tensile stress.

19. The image sensor of claim 17, wherein the second stress of the second nitride layer is a compressive stress.

20. The image sensor of claim 17, wherein a value of the first stress of the first nitride layer is less than a value of the second stress of the second nitride layer.

* * * * *